United States Patent
Gorobets et al.

(10) Patent No.: US 9,042,160 B1
(45) Date of Patent: May 26, 2015

(54) MEMORY DEVICE WITH RESISTIVE RANDOM ACCESS MEMORY (RERAM)

(71) Applicant: Sandisk Technologies Inc., Plano, TX (US)

(72) Inventors: Sergey Anatolievich Gorobets, Edinburgh (GB); Aaron Keith Olbrich, Morgan Hill, CA (US); Manuel Antonio D'Abreu, El Dorado Hills, CA (US); Xinde Hu, San Diego, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/323,704

(22) Filed: Jul. 3, 2014

(51) Int. Cl.
  G11C 7/10 (2006.01)
  G11C 7/00 (2006.01)
  G11C 16/10 (2006.01)
  G11C 5/06 (2006.01)
  G11C 13/00 (2006.01)
  G11C 8/16 (2006.01)

(52) U.S. Cl.
  CPC .......... *G11C 16/10* (2013.01); *G11C 13/0002* (2013.01); *G11C 7/10* (2013.01); *G11C 7/1006* (2013.01); *G11C 8/16* (2013.01); *G11C 7/1078* (2013.01); *G11C 7/1096* (2013.01); *G11C 7/00* (2013.01); *G11C 7/1087* (2013.01); *G11C 13/0069* (2013.01)

(58) Field of Classification Search
  CPC .......... G11C 13/0069; G11C 13/0002; G11C 7/1006; G11C 7/1087; G11C 7/1096; G11C 8/16; G11C 7/00; G11C 7/1078; G11C 7/10; G11C 16/10
  USPC .............. 365/189.2, 185.17, 189.04, 189.17, 365/189.05, 185.33, 148, 185.09
  See application file for complete search history.

(56) References Cited

U.S. PATENT DOCUMENTS

| | | | |
|---|---|---|---|
| 6,651,032 B2 * | 11/2003 | Peterson et al. | 702/181 |
| 7,916,538 B2 | 3/2011 | Jeon et al. | |
| 2002/0021223 A1 * | 2/2002 | Jen et al. | 340/628 |
| 2008/0082762 A1 * | 4/2008 | Taeuber et al. | 711/154 |
| 2012/0170361 A1 * | 7/2012 | Ranjan et al. | 365/171 |
| 2012/0303870 A1 * | 11/2012 | Park et al. | 711/103 |
| 2013/0094301 A1 * | 4/2013 | Min | 365/189.02 |
| 2013/0128671 A1 | 5/2013 | Shin et al. | |
| 2013/0279249 A1 | 10/2013 | Yun et al. | |
| 2013/0326113 A1 * | 12/2013 | Wakrat et al. | 711/103 |
| 2014/0070860 A1 * | 3/2014 | Lin | 327/170 |
| 2014/0115352 A1 * | 4/2014 | Seroff | 713/300 |
| 2014/0164868 A1 * | 6/2014 | Haratsch et al. | 714/763 |

* cited by examiner

*Primary Examiner* — Ly D Pham
(74) *Attorney, Agent, or Firm* — Toler Law Group, PC

(57) ABSTRACT

A method includes, in a data storage device that includes a non-volatile memory and a resistive random access memory (ReRAM) on the same die, receiving data from a memory controller via a bus. The method also includes routing the data to data latches of the non-volatile memory via a first path and to the ReRAM via a second path distinct from the first path.

27 Claims, 7 Drawing Sheets

MEMORY DEVICE WITH RESISTIVE RANDOM ACCESS MEMORY (RERAM)

FIELD OF THE DISCLOSURE

The present disclosure is generally related to a memory device with resistive random access memory (ReRAM).

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

Data sent to a non-volatile data storage device is susceptible to data loss if the non-volatile data storage device loses power prior to the data being stored in a non-volatile memory. A non-volatile data storage device may include on-board capacitors in a memory portion of the non-volatile data storage device to complete programming and/or to save data in the case of a loss of power. However, the on-board capacitors may add additional costs to manufacturing the non-volatile data storage device and may increase a size of the non-volatile data storage device due to a physical size of the capacitors.

SUMMARY

A data storage device includes a controller coupled to a memory device (e.g., a memory die) that includes a non-volatile memory and a resistive random access memory (ReRAM). The controller may be coupled via a bus to the non-volatile memory and to the ReRAM. For example, the ReRAM may be coupled to the bus by a bus-to-ReRAM interface and the non-volatile memory may be coupled to the bus via a set of one or more latches (e.g., one or more data latches).

In accordance with the described techniques, the controller may send data to the memory device via the bus. The data may be provided to the memory device to be stored at the non-volatile memory via the set of one or more data latches. Alternatively, or in addition, the data may also be provided to be stored at the ReRAM. An amount of time to store the data at the ReRAM may be less than an amount of time to store the data at the non-volatile memory using the set of data latches. Accordingly, the controller may store data more quickly to the ReRAM than to the non-volatile memory. Additionally, the ReRAM may be used to maintain the data at the memory device in the event of a power loss while the data is being written to the non-volatile memory. For example, if a loss of power occurs before all of the data is written to the non-volatile memory from the set of latches, the data may be recovered from the ReRAM and written to the non-volatile memory after power is restored. Accordingly, the ReRAM may provide a high-efficiency solution to protect data being stored to the non-volatile memory in the event of a loss of power.

DETAILED DESCRIPTION

Particular embodiments of the present disclosure are described with reference to the drawings. In the description, common features are designated by common reference numbers throughout the drawings.

Figure 1:
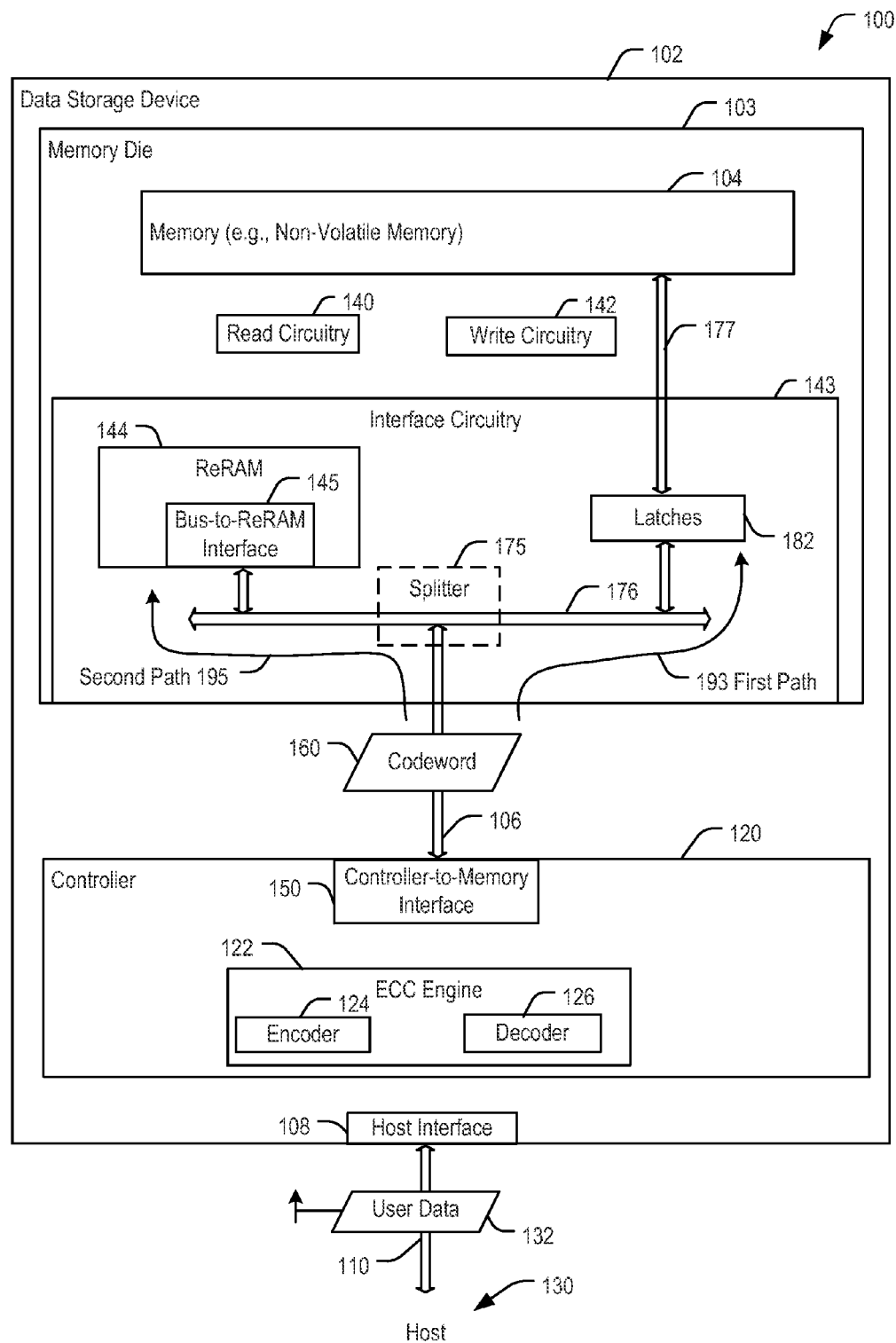
FIG. 1 is a block diagram of a particular illustrative embodiment of a system including a data storage device having a memory device with resistive random access memory (ReRAM)

FIG. 1 is a block diagram of a particular illustrative embodiment of a system 100 including a data storage device 102 and a host device 130. The data storage device 102 includes a controller 120 (e.g., a memory controller) coupled to a memory device including one or more memory dies, such as a representative memory die 103. The memory die 103 may include a memory 104 (e.g., a non-volatile memory, such as a flash memory) and a resistive random access memory (ReRAM) 144.

The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration. In some embodiments, the data storage device 102 may include or correspond to a solid state drive (SSD), which may be used as an embedded storage drive, an enterprise storage drive (ESD), or a cloud storage drive (CSD).

The data storage device 102 may be coupled to the host device 130 via a communication path 110, such as a wired communication path and/or a wireless communication path. For example, the data storage device 102 may include an interface 108 (e.g., a host interface) that enables communication (via the communication path 110) between the data storage device 102 and the host device 130, such as when the interface 108 is coupled to the host device 130.

The host device 130 may include a processor and a memory. The memory may be configured to store data and/or instructions that may be executable by the processor. The memory may be a single memory or may include one or more memories, such as one or more non-volatile memories (e.g., a ReRAM, a flash, or a combination thereof), one or more volatile memories, or a combination thereof. The host device 130 may issue one or more commands to the data storage device 102, such as one or more requests to read data from or write data to the memory 104 of the data storage device 102. For example, the host device 130 may send data, such as user data 132 to be written to the memory 104 of the data storage device 102.

The data storage device 102 includes a controller 120 coupled to the memory die 103. The controller 120 may be coupled to the memory die 103 via a bus 106, an interface (e.g., a controller-to-memory interface 150), another structure, or a combination thereof. The memory die 103 may be separate from the controller 120 and coupled to the controller 120 (e.g., via the bus 106). For example, the controller 120 may be included in a particular die that distinct from the memory die 103. However, in other implementations, the memory die 103 may include the controller 120.

The memory die 103 may be coupled to the controller 120 via the bus 106, interface circuitry 143, another structure, or a combination thereof. The interface circuitry 143 may include a bus 176, the ReRAM 144, and a set of one or more latches 182. The bus 176 may be coupled to or an extension of the bus 106. For example, the bus 106 and the bus 176 may be a single bus. The bus 176 (e.g., the bus 106) may be coupled to the ReRAM 144 and to the memory 104. For example, the bus 176 (e.g., the bus 106) may be coupled to the memory 104 via the set of one or more latches 182. Although the one or more latches 182 are illustrated as being separate from the memory 104, in other embodiments the memory 104 may include the set of latches 182.

The interface circuitry 143 may be configured to route data to and from the controller 120. In some embodiments, the interface circuitry 143 (e.g., the bus 176) may include a splitter 175 configured to route data from the controller 120 to the ReRAM 144 and/or to the set of latches 182. For example, the splitter 175 may concurrently route the data from the controller 120 (e.g., the bus 106) to the ReRAM 144 and to the set of latches 182. Additionally, the interface circuitry 143 may be configured to enable data to be communicated from the ReRAM 144 to the set of latches 182.

The ReRAM 144 may include a bus-to-ReRAM interface 145, via which the ReRAM 144 is coupled to the bus 176 (e.g., the bus 106). The bus-to-ReRAM interface 145 may include a NAND interface. To illustrate, the NAND interface may include an open NAND flash interface (ONFI) compliant interface. The bus-to-ReRAM interface 145 may enable the ReRAM 144 to access data communicated via the bus 176 (e.g., the bus 106) and to route the data via the bus 176. For example, the ReRAM 144 may be configured to store control data generated by the controller 120. The control data may include logical-to-physical mapping data, block mapping data, processor variables, processor context data, or a combination thereof, as illustrative, non-limiting examples. Alternatively, or in addition, the ReRAM 144 may be configured to store the user data 132 that is to be written to the memory 104. In addition to the user data 132, the ReRAM 144 may store metadata associated with the user data 132, an address (e.g., location information) associated with an address of the memory where the user data 132 is to be stored, and an indicator (e.g., a one or more bits) that indicate whether the user data 132 is stored at the memory 104, as illustrative, non-limiting examples. For example, when the user data 132 is stored at the ReRAM 144 and prior to a write operation being completed to store the user data 132 at the memory 104, the indicator may be de-asserted (e.g., have a bit value of logical zero). After the write operation is completed, the indicator may be asserted (e.g., set to have a bit value of logical one).

The memory 104 may include a non-volatile memory (e.g., a NAND flash memory). A size of the memory 104 may be larger than a size of the ReRAM 144. The memory 104 may include a two dimensional (2D) memory configuration or a three dimensional (3D) memory configuration. The memory 104 may include a group of storage elements. The group of storage elements may be arranged in one or more pages, one or more wordlines, and/or one or more blocks. For example, each of multiple word lines may include one or more pages (e.g., physical pages). Additionally, each of the multiple word lines may be included in a block of the memory 104. Each storage element of the group of storage elements may be configured as a single-level cell (SLC) or a multi-level cell (MLC) cell. The memory 104 may store data, such as the user data 132 or encoded user data, such as a codeword 160, as described further herein. The memory 104 (e.g., the non-volatile memory, such as a flash memory) may be configured to use the set of latches 182 to access data communicated via the bus 176 (e.g., the bus 106) and to route the data via the bus 176 (e.g., the bus 106).

The memory die 103 may further include read circuitry 140 and write circuitry 142. Although illustrated as separate components, the read circuitry 140 and the write circuitry 142 may be included in a single component of the memory die 103. The read circuitry 140 and the write circuitry 142 may be configured to enable operations of reading data from the memory 104 and writing data to the memory 104, respectively. For example, the write circuitry 142 may be configured to write data from the latches 182 to the memory 104 and the read circuitry 140 may be configured to read the data from the memory 104 to the latches 182. In some embodiments, the read circuitry 140 and/or the write circuitry 142 may also be configured to enable operations of reading data from and writing data to the ReRAM 144. In other embodiments, the ReRAM 144 may include read circuitry, write circuitry, or a combination thereof.

The controller 120 may be configured to receive data and commands (e.g., instructions) from the host device 130 and may access the memory 104 and/or the ReRAM 144 based on the received commands. The controller 120 may send one or more write requests to the memory 104 to store the data to a specified address of the memory 104. The write request may specify a physical address of a portion of the memory 104 (e.g., a physical address of a word line of the memory 104) that is to store the data. Additionally, or in the alternative, the controller 120 may send data to be stored at the ReRAM 144, such as to an address of the ReRAM 144. The controller 120 may concurrently send the data to the memory 104 (e.g., the set of latches 182) and to the ReRAM 144. Alternatively, the controller 120 may send the data to one of the ReRAM 144 or the memory 104 prior to sending the data to the other. The controller 120 may be configured to send a read request to the memory 104 to access data from a specified address of the memory 104. To illustrate, the controller 120 may send a read request to access the data stored in the memory 104. The read request may specify the physical address of a portion of the memory 104 (e.g., a physical address of a word line storing the data). Additionally, the controller 120 may be configured to send a read request to the ReRAM 144 to access data from a specified location of the ReRAM 144 or to initiate a transfer of the data from the ReRAM 144 to the memory 104.

Additionally, the data storage device 102 may include an error correction code (ECC) engine 122. The ECC engine 122 may be configured to receive data, such as the user data 132, and to generate one or more error correction code (ECC) codewords (e.g., including a data portion and a parity portion) based on the data. For example, the ECC engine 122 may receive the user data 132 and may generate the codeword 160. To illustrate, the ECC engine 122 may include an encoder 124 configured to encode the data using an ECC encoding technique. The ECC engine 122 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine 122 may include a decoder 126 configured to decode data read from the memory 104 to detect and correct bit errors that may be present in the data. For example, the ECC engine 122 may correct a number of bit errors up to an error correction capability of an ECC technique used by the ECC engine 122. A number of errors identified by the ECC engine 122 may be tracked by the controller 120, such as by the ECC engine 122. For example, based on the number of errors, the ECC engine 122 may determine a bit error rate (BER) associated with the memory 104.

During operation, the controller 120 may receive, from the host device 130, first data to be stored at the memory 104. The controller 120 may send the first data (or an encoded version of the first data) to the memory die 103 to be stored at the memory 104. For example, the controller 120 may send the first data to the memory 104 via the set of latches 182. To illustrate, the controller 120 may send the first data to the memory 104 (e.g., the set of latches 182) via a first path 193.

Additionally, the controller 120 may also send the first data to the ReRAM 144. For example, the controller 120 may send the first data to the ReRAM 144 via a second path 195. Accordingly, the ReRAM 144 may receive and store the same first data to be written to the memory 104 (e.g., the first data provided to the set of latches 182). To illustrate, the controller 120 may provide the first data to the memory die 103 via the bus 106 and the first data may be received at the splitter 175. The splitter 175 may route the first data to the data set of latches 182 (e.g., an interface of the memory 104) and to the bus-to-ReRAM interface 145 of the ReRAM 144. In some embodiments, the first data may be concurrently routed to the ReRAM 144 and the set of latches 182. In other embodiments, the first data may be routed to the ReRAM 144 prior to being routed to the set of latches 182. In other embodiments, the first data may be routed to the set of latches 182 prior to being routed the ReRAM 144.

The ReRAM 144 may store the first data at least until the first data is stored at the memory 104. To illustrate, an amount of write time to write the data to the ReRAM 144 (e.g., a ReRAM write latency) may be shorter than a second amount of time to write the data to the memory 104. Accordingly, in the event of a loss of power that occurs before an entirety of the first data is written to the memory 104 from the set of latches 182, the first data may be able to be recovered from the ReRAM 144 and written to the memory 104 after power is resumed.

The controller 120 may also be configured to receive second data from the host device 130 to be stored at the memory 104. The controller 120 may send the second data to the memory 104 and to the ReRAM 144 via the bus 106 (e.g., the bus 176). The ReRAM 144 may receive and store the second data before an entirety of the second data is written to the memory 104. If the ReRAM 144 receives the second data after an entirety of the first data has been written to the memory 104, the ReRAM 144 may overwrite the first data to store the second data.

In a particular embodiment, the controller 120 may send data to the set of latches 182 to be written to the memory 104. The controller 120 may also send the data to the ReRAM 144. The data may be written to the ReRAM 144 more quickly than the data is written the memory 104 via the set of latches 182. If a loss of power to the memory die 103 occurs before the data is finished being written to the memory 104, the unwritten data (e.g., a portion of the data stored in the set of laches 182) may be lost. After power is restored to the memory die 103, logic circuitry (not shown) included in the memory die 103 may recover the data from the ReRAM 144 and provide the recovered data to the set of latches 182 to be written to the memory 104, as described with reference to FIG. 4.

In some embodiments, the controller 120 may include a memory (not shown). For example, the controller 120 may include a single memory component, such as a random access memory, or may include multiple distinct memory components and/or multiple different types of memory components. To illustrate, the controller 120 may include one or more volatile memories and one or more non-volatile memories, such as a controller ReRAM. Alternatively, or in addition, the controller 120 may be coupled to one or more other memories, such as a dynamic random access memory (DRAM) or a ReRAM (distinct from the ReRAM 144).

By sending data to the ReRAM 144, the controller 120 may write the data to the memory die 103 more quickly than if the data were written to the memory 104. Additionally, the controller 120 may also write the data to the memory 104 via the set of latches 182. If a loss of power occurs before all of the data is written to the memory 104 via the set of latches 182, the ReRAM 144 may advantageously be used to provide the data to the set of latches 182 and to enable the data to be written to the memory 104 after power is restored. Thus, the data storage device 102 may maintain the data in the event of a power loss without using capacitors to extend a write capability during a power loss, which may reduce a cost of manufacturing the data storage device 102 by omitting the capacitors and may reduce a size of the data storage device 102 that would otherwise be occupied by a physical size of the capacitors.

Figure 2:
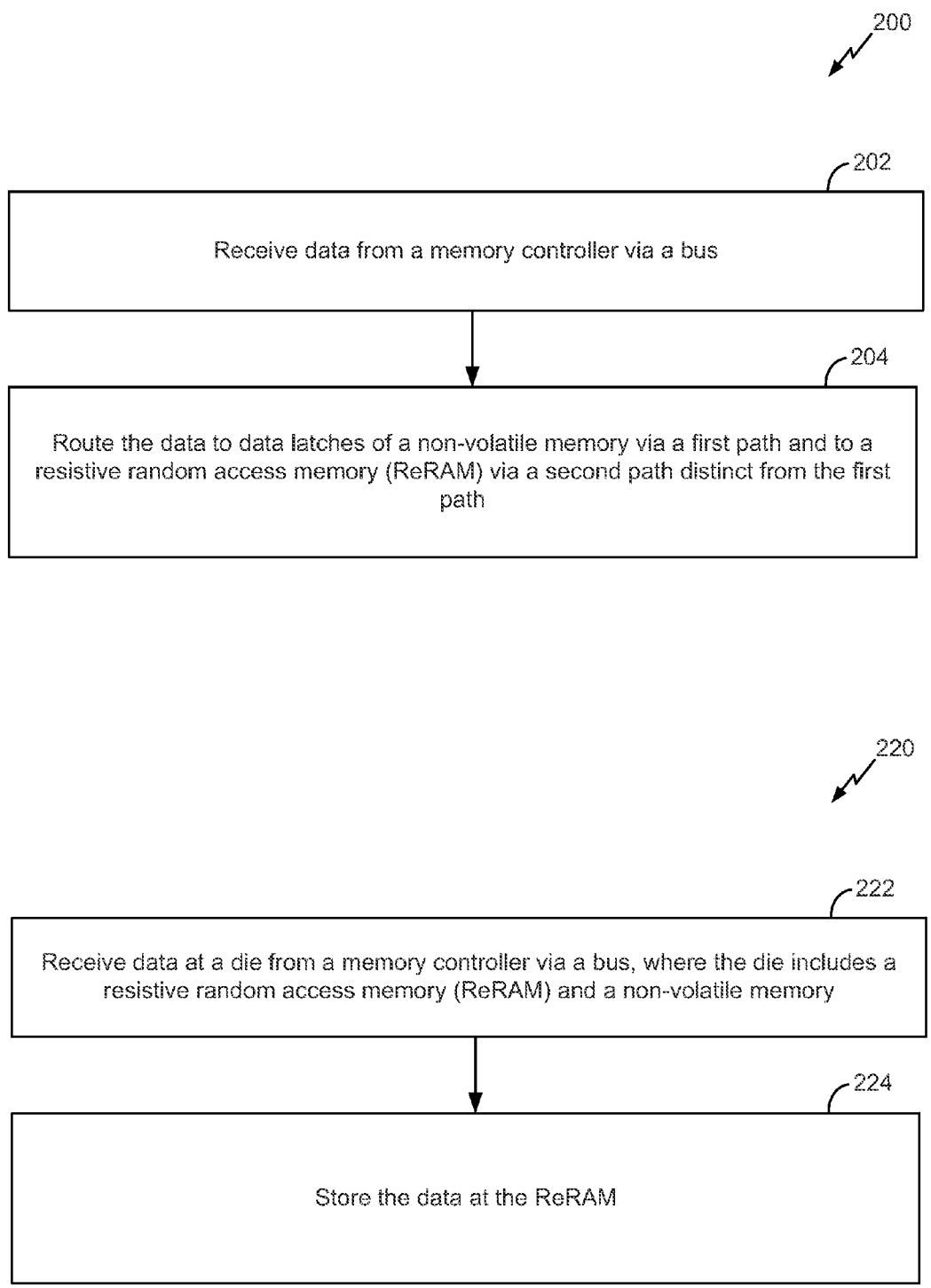
FIG. 2 is a first flow diagram and a second flow diagram of illustrative embodiments of methods to operate the data storage device of FIG. 1.

Referring to FIG. 2, illustrative embodiments of a method 200 and a method 220 to enable use of a memory device with resistive random access memory (ReRAM) are shown. For example, the method 200 and the method 220 may be performed by a data storage device, such as the data storage device 102 (e.g., the interface circuitry 143) of FIG. 1. The memory device may include or correspond to the memory die 103 that includes the ReRAM 144 and the memory 104 of FIG. 1.

The method 200 includes receiving data from a memory controller via a bus, at 202. For example, the memory controller may include or correspond to the controller 120 of FIG. 1. The memory controller may receive the data from a host device, such as the host device 130 of FIG. 1, or may generate the data internally at the memory controller. The memory controller may initiate a write operation of the data to a non-volatile memory, such as the memory 104 of FIG. 1, and may send the data via the bus in accordance with the write operation. For example, the memory controller may send the data via the bus 106 and/or the bus 176 of FIG. 1.

The method 200 further includes routing the data to data latches of a non-volatile memory via a first path and to a resistive random access memory (ReRAM) via a second path that is distinct from the first path, at 204. The data may be routed via the first path and the second path by a circuitry and/or logic, such as the splitter 175, included in the memory device. The data latches of the non-volatile memory may include or correspond to the set of latches 182 of the memory 104 of FIG. 1. The ReRAM may include or correspond to the ReRAM 144 of FIG. 1. For example, the data may be routed by the splitter 175 to the set of latches 182 via the first path 193 and routed to the ReRAM 144 via the second path 195 of FIG. 1.

Referring to the method 220, the method 220 includes receiving data at a die from a memory controller via a bus, where the die include a resistive random access memory (ReRAM) and a non-volatile memory, at 222. For example, the memory controller and the die may include or correspond to the controller 120 and the memory die 103 of FIG. 1, respectively. The memory controller may receive the data from a host device, such as the host device 130 of FIG. 1, or may generate the data internally at the memory controller. The memory controller may initiate a write operation of the data to a non-volatile memory, such as the memory 104 of FIG. 1, and may send the data via the bus in accordance with the write operation. For example, the memory controller may send the data via the bus 106 and/or the bus 176 of FIG. 1.

The method 220 further includes storing the data at the ReRAM, at 224. The ReRAM is included on the same die as a non-volatile memory. For example, the ReRAM and the non-volatile memory may include or correspond to the ReRAM 144 and the memory 104 of FIG. 1, respectively. The data may include user data to be stored at the non-volatile memory and/or an address (e.g., a physical address) associated with the non-volatile memory, as illustrative, non-limiting examples. Alternatively, or in addition, the data may include control data, such as logical-to-physical mapping data, block mapping data, processor variables, processor context data, or a combination thereof, as illustrative, non-limiting examples. To illustrate, the data may include update data to update a logical-to-physical mapping table stored at the ReRAM. When the data includes the update data, storing the data may include overwriting a portion of the logical-to-physical mapping table, such as logical-to-physical mapping table data previously stored at the ReRAM.

The methods 200 and 220 may enable data to quickly be stored at the memory by sending the data to the ReRAM. For example, the data may be written to the ReRAM more quickly than the data is written to the non-volatile memory via the data latches.

The method 200 and/or the method 220 of FIG. 2 may be initiated or controlled by an application-specific integrated circuit (ASIC), a processing unit, such as a central processing unit (CPU), a digital signal processor (DSP), a controller, another hardware device, a firmware device, a field-programmable gate array (FPGA) device, or any combination thereof. As an example, the method 200 and/or the method 220 of FIG. 2 can be initiated or controlled by one or more processors, such as one or more processors included in or coupled to a controller. A controller configured to perform the method 200 of FIG. 2 may be able to route data to a non-volatile memory (via a set of data latches) and/or to a ReRAM and a controller configured to perform the method 220 of FIG. 2 may be able to store data at a ReRAM that is included in a same memory die as a non-volatile memory.

Figure 3:
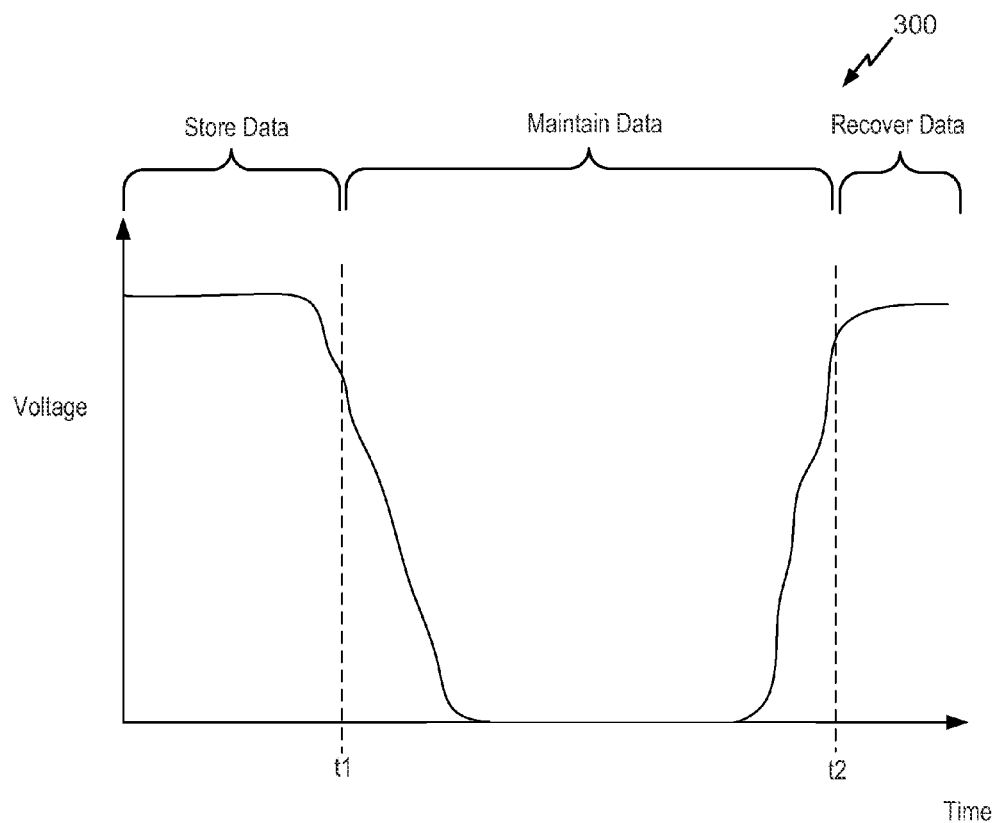
FIG. 3 is a graph of an illustrative example of voltage supplied to the data storage device of FIG. 1.

Referring to FIG. 3, a graph of a power event is illustrated and generally designated 300. For example, the graph 300 may illustrate voltage supplied to a data storage device, such as the data storage device 102, over a period of time. In a particular embodiment, the graph 300 illustrates voltage provided to a memory device, such as the memory die 103 of FIG. 1, over a period of time.

Prior to a first time (t1) the data storage device may receive sufficient voltage to operate the data storage device and data may be stored to the memory device of the data storage device. The data may be stored to a ReRAM and/or a non-volatile memory included on the same memory die of the memory device. For example, the ReRAM and the non-volatile memory may include or correspond to the ReRAM 144 and the memory 104 of FIG. 1, respectively. To illustrate, first data may be written to the ReRAM and to the non-volatile memory.

At the first time (t1), the data storage device may experience a power event, such as a low-voltage condition. In a particular embodiment, the power event occurs after the first data is written to the ReRAM and during a first write operation to write the first data to the non-volatile memory. For example, the power event may occur before all of the first data is written to the non-volatile memory.

During a time period between the first time (t1) and a second time (t2), the first data may be maintained at the ReRAM. At the second time (t2), an operable voltage level may be received by the data storage device (e.g., the power event may end).

After the second time (t2), in response to the first write operation of the first data to the non-volatile memory being interrupted by the power event, control logic (e.g., the controller 120 of FIG. 1 or control logic included in the memory device) associated with the memory device may recover the first data from the ReRAM and a second write operation may be initiated to write the first data to the non-volatile memory. For example, the first data recovered from the ReRAM may be provided to data latches of the non-volatile memory, such as the set of data latches 182 of the memory 104 of FIG. 1, and the second write operation may be initiated after the first data is provided to the data latches from the ReRAM. To illustrate, the ReRAM may be coupled to the data latches via a bus, such as the bus 176 of FIG. 1. Thus, by storing the first data at the ReRAM, the ReRAM may advantageously be used to recover the first data in the event of a loss of power during a write operation to write the first data to the non-volatile memory.

Figure 4:
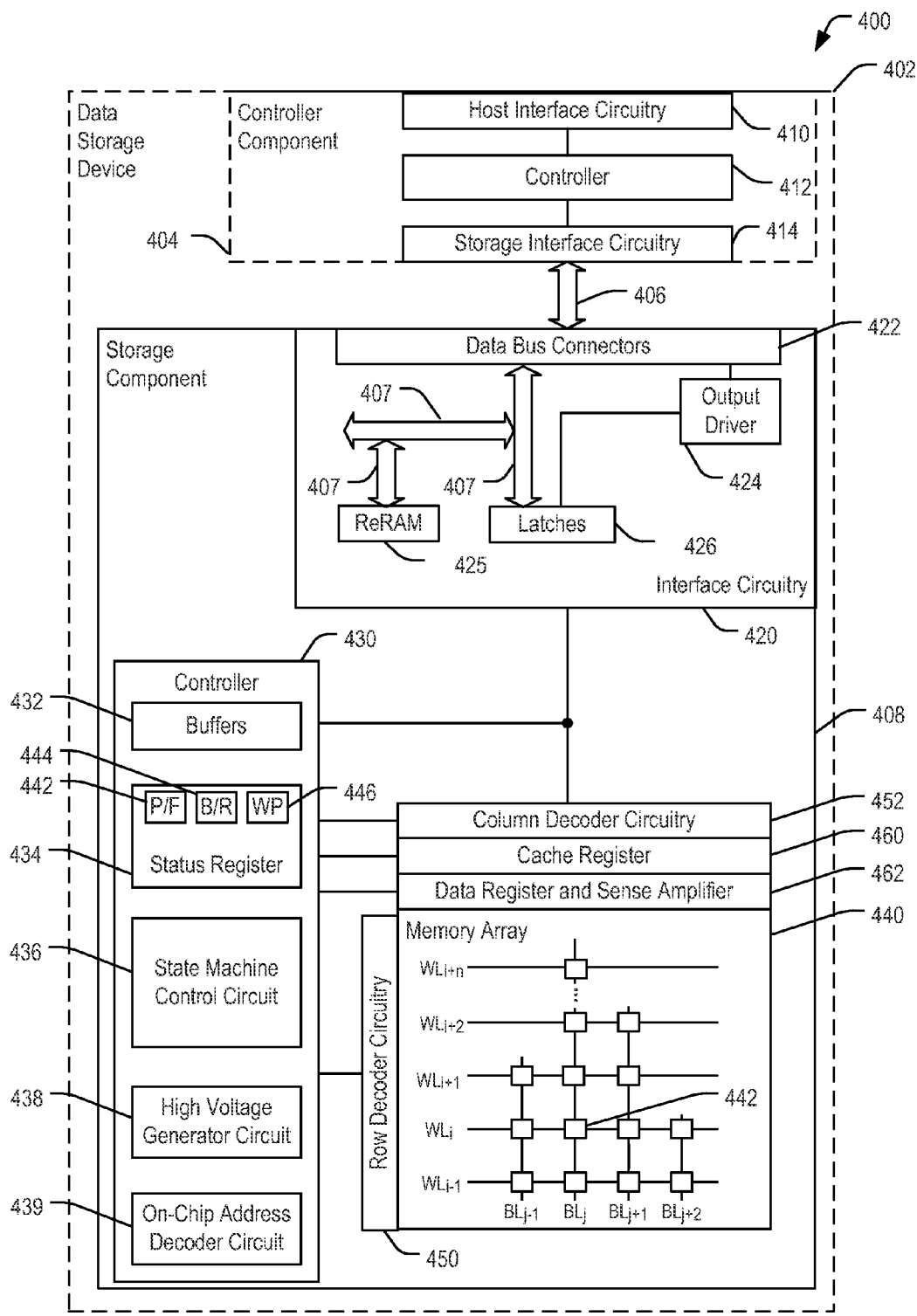
FIG. 4 is a block diagram of another illustrative system including a memory device with ReRAM.

Referring to FIG. 4, an illustrative embodiment of a system 400 is depicted and generally designated 400. The system 400 includes a data storage device 402 that includes a controller component 404 coupled to a storage component 408.

In a particular embodiment, the data storage device 402 may be the data storage device 102 of FIG. 1. The controller component 404 may include host interface circuitry 410, a controller 412, and storage interface circuitry 414. The controller component 404 may include or correspond to the controller 120 of FIG. 1. For example, the host interface circuitry 410 and the storage interface circuitry 414 may include or correspond to the host interface 108 and the controller-to-memory interface 150 of FIG. 1, respectively.

The controller component 404 may be coupled to the storage component 408 via a bus 406, such as an 8-bit or 16-bit parallel data bus, as an illustrative, non-limiting example. The bus 406 may include or correspond to the bus 106 and/or the bus 176 of FIG. 1. The controller component 404 may communicate instructions and data with an external host (not shown) via the host interface circuitry 410. The controller 412 may be configured to respond to instructions received by the host interface circuitry 410 and may also be configured to send and receive data and instructions to the storage component 408 via the storage interface circuitry 414.

In a particular embodiment, the storage component 408 includes interface circuitry 420, a controller 430 coupled to the interface circuitry 420, and a memory array 440 accessible to the controller 430. For example, the memory array 440 may include or correspond to the memory 104 of FIG. 1.

The memory array 440 may include multiple wordlines and multiple bit lines. For example, the memory array 440 may include a first wordline $WL_{i-1}$, a second wordline $WL_i$, a third wordline $WL_{i+1}$, a fourth wordline $WL_{i+2}$, and a fifth wordline $WL_{i+n}$. Although the memory array 440 is illustrated as having five wordlines, the memory array 440 may include more than five wordlines or fewer than five wordlines. As another example, the memory array may include a first bit line $BL_{j-1}$, a second bit line $BL_j$, a third bit line $BL_{j+1}$, and a fourth bit line $BL_{j+2}$. Although the memory array 440 is illustrated as having four bit lines, the memory array may include more than four bit lines or fewer than four bit lines.

The storage component 408 may include row decoder circuitry 450 and column decoder circuitry 452 that enable access to data stored at one or more particular rows and particular columns of the memory array 440, such as to read a value from or to write a value to a particular memory cell 442 at a bit line $BL_j$ and at wordline $WL_i$. A cache register 460 and a data register and sense amplifier 462 may further be coupled to the memory array 440 and may be used to cache or to temporarily store data that is to be written to the memory array 440 or data that has been read out of the memory array 440. In a particular embodiment, the memory array 440 may include a flash memory. In some embodiments, the memory array 440 may include a 3D memory, as described further with reference to FIG. 7.

In a particular embodiment, the controller 430 includes one or more buffers 432 to store instructions, data, or any combination thereof. The controller 430 may also include one or more status registers 434, a state machine control circuit 436, a high voltage generator circuit 438, and an on-chip address decoder circuit 439. The controller 430 may be coupled to provide electrical signals to the row decoder circuitry 450, to the column decoder circuitry 452, to the cache register 460, and to the data register and sense amplifier 462.

In a particular embodiment, the status register 434 of the controller 430 may include one or more indicators storing values, such as a Pass/Fail (P/F) value 442, a Busy/Ready (B/R) value 444, a write protect (WP) value 446, one or more other indicators, or a combination thereof. The status register 434 may be accessible to the state machine control circuit 436.

The state machine control circuit 436 may include dedicated hardware and circuitry to control an operation of the controller 430 in response to one or more received instructions and internal states, such as may be represented at the status register 434. The state machine control circuit 436 may include states such as a read status state, a data write state, a data read state, as illustrative, non-limiting examples.

In a particular embodiment, the high voltage generator circuit 438 may be responsive to the state machine control circuit 436 and may be configured to generate a high voltage to program values to, or erase values from, the memory array 440. For example, the memory array 440 may be a flash memory or other memory that may be programmable or erasable via a "high" voltage, such as, for example, five volts (V). The controller 430 may also include the on-chip address decoder circuit 439 that may include hardware and logic circuitry to receive memory address information from the controller component 404 and to decode the memory address information to specific rows and columns to be provided to the row decoder circuitry 450 and the column decoder circuitry 452.

The interface circuitry 420 may include data bus connectors 422, an output driver 424 coupled to the data bus connectors 422, a bus 407, a ReRAM 425, and latches 426. The interface circuitry 420 may include or correspond to the interface circuitry 143 of FIG. 1. For example, the ReRAM 425 and the latches 426 may include or correspond to the ReRAM 144 and the set of latches 182 of FIG. 1, respectively. The bus 407 may include or correspond to the bus 176 of FIG. 1. The data bus connectors 422 may include or correspond to the splitter 175 of FIG. 1.

The data bus connectors 422 may include physical electrical connectors that couple the interface circuitry 420 to the data bus 406. The output driver 424 may include dedicated circuitry and electrical connections to enable the interface circuitry 420 to drive electrical signals over the bus 406. In a particular embodiment, the interface circuitry 420 is configured to comply with one or more bus communications protocols or standards. The latches 426 may be configured to store or to latch data that is received via the data bus connectors 422 or data that is to be written to the data bus 406 via the data bus connectors 422. Although the ReRAM 425 is illustrated in FIG. 4 as being included in the interface circuitry 420, in alternate embodiments the ReRAM 425 may be external to the interface circuitry 420 and/or may be part of the on-board controller 430 of the storage component 408.

The controller 430 may be configured to determine whether a power event (e.g., a loss of power) occurred during a write operation to write data included in the latches 426 to the memory array 440. For example, based on a power restoration after the power event, the controller 430 may determine whether the write operation was completed based on an indicator (corresponding to the data) that is stored at the ReRAM 425. If the indicator is de-asserted (e.g., has value of logical zero), the controller 430 may determine that the write operation was not completed (e.g., the write operation was interrupted by the power event). If the indicator is asserted (e.g., has a value of logical one), the controller 430 may determine that the write operation was completed (e.g., an entirety of the data is stored at the memory array 440).

If the controller 430 determines that the power event occurred during the write operation, the controller 430 may identify a location of the ReRAM 425 that stores the data and may cause the data to be provided from the ReRAM 425 to the latches 426. Additionally, the controller 430 may initiate another write operation to write the data from the latches 426 to the memory array 440.

Figure 5:
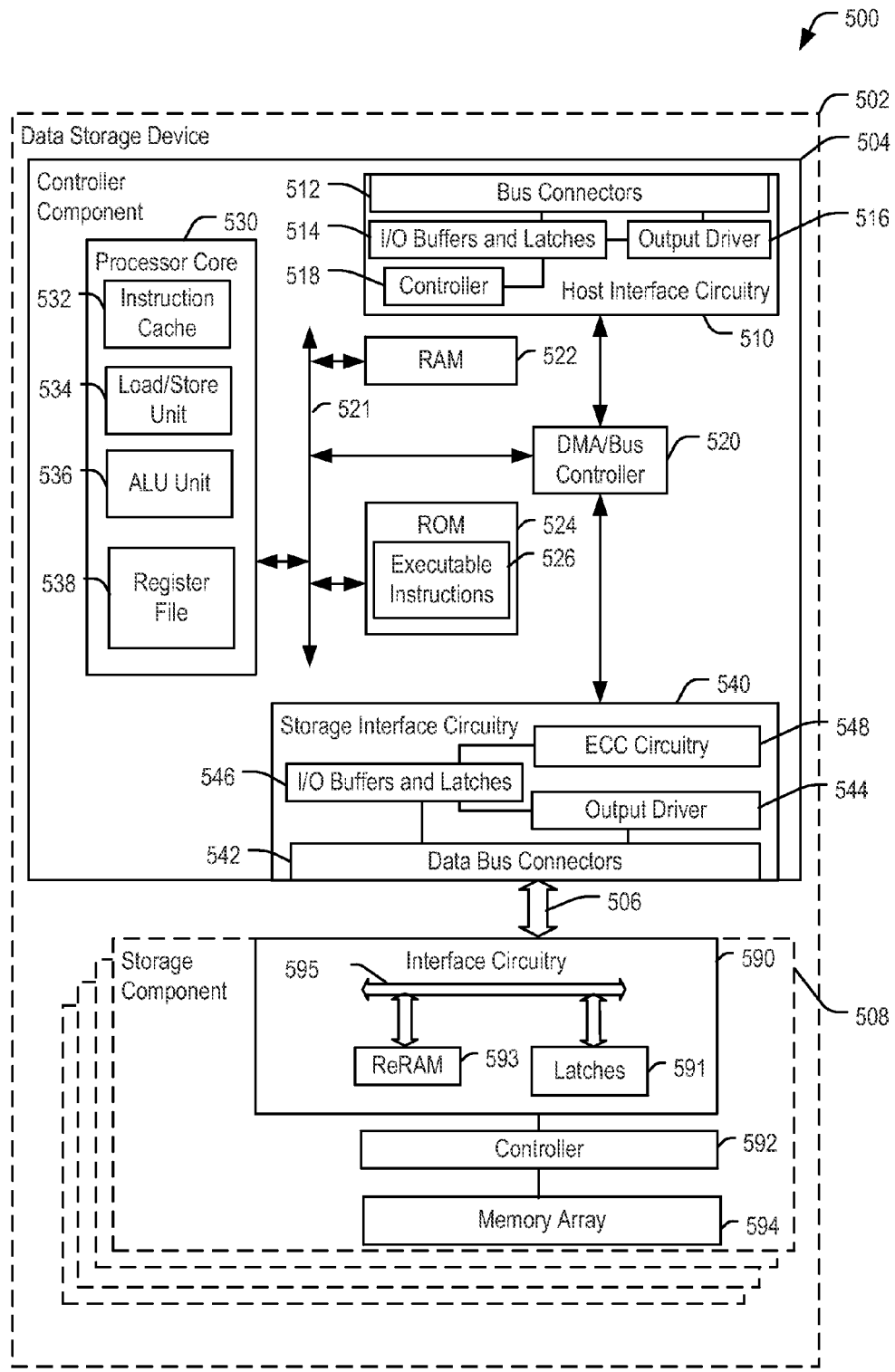
FIG. 5 is a block diagram of another illustrative system including a memory device with ReRAM.

Referring to FIG. 5, an illustrative embodiment of a system is depicted and generally designated 500. The system 500 includes a data storage device 502 that includes a controller component 504 coupled to one or more storage components, such as a representative storage component 508, via a bus 506. The data storage device 502 may include or correspond to the data storage device 102 of FIG. 1 and/or the data storage device 402 of FIG. 4. The bus 506 may include or correspond to the bus 106, the bus 176 of FIG. 1, the bus 406, and/or the bus 407 of FIG. 4. The controller component 504 may include or correspond to the controller 120 of FIG. 1 and/or the controller component 404 of FIG. 4.

The representative storage component 508 may include or correspond to the memory die 103 of FIG. 1 and/or the storage component 408 of FIG. 4. The representative storage component 508 includes interface circuitry 590 to communicate via the bus 506. For example, the interface circuitry 590 may include or correspond to the interface circuitry 143 of FIG. 1 and/or the interface circuitry 420 of FIG. 4. The interface circuitry 590 may include a bus 595, a ReRAM 593, and latches 591. The bus 595 may be coupled to or be an extension of the bus 506. For example, the bus 595 may include or correspond to the bus 106, the bus 176 of FIG. 1, the bus 406, and/or the bus 407 of FIG. 4. The ReRAM 593 may include or correspond to the ReRAM 144 of FIG. 1 and/or the ReRAM 425 of FIG. 4. The latches 591 may include or correspond to the latches 182 of FIG. 1 and/or the latches 426 of FIG. 4.

The storage component 508 also includes a controller 592 that is coupled to the interface circuitry 590 and that is also coupled to a memory, such as a memory array 594. The controller 592 may include or correspond to the controller 430 of FIG. 4. The memory array 594 may include one or more types of storage media such as a flash memory (e.g., a NAND array). For example, the memory array 594 may include or correspond to the memory 104 of FIG. 1 and/or the memory array 440 of FIG. 4. The memory array 594 may have a 2D configuration. In some embodiments, the memory array 594 may have a 3D configuration, as described further with reference to FIG. 7.

In a particular embodiment, the controller component 504 includes host interface circuitry 510 coupled to a direct memory access (DMA)/bus controller 520. For example, the host interface circuitry 510 may include or correspond to the host interface 108 of FIG. 1 and/or the host interface circuitry 410 of FIG. 4. The controller component 504 also includes storage interface circuitry 540, such as the controller-to-memory interface 150 of FIG. 1 and/or the storage interface circuitry 414 of FIG. 4, that is coupled to the DMA/bus controller 520. A processor core 530, a random access memory (RAM) 522 and a read-only memory (ROM) 524 are coupled to the DMA/bus controller 520 via an internal bus 521.

In a particular embodiment, the host interface circuitry 510 includes bus connectors 512 coupled to input/output (I/O) buffers and latches 514. The bus connectors 512 are further coupled to output driver circuitry 516. The host interface circuitry 510 also includes a controller 518. In a particular embodiment, the host interface circuitry 510 operates in accordance with a universal serial bus (USB) protocol. For example, the controller 518 may be programmed to receive USB protocol instructions and data from a host device (not shown) via the bus connectors 512 that are coupled to a universal serial bus. The controller 518 may include a hardware processor that executes instructions stored at an internal memory, such as a read-only memory (not shown) to enable receipt and acknowledgment of USB instructions and data. Alternatively, or in addition, the host interface circuitry 510 may be configured to support other communication protocols, such as a Secure Digital (SD) protocol, a small computer system interface (SCSI), parallel interface (SPI), a Compact Flash (CF) protocol, one or more other protocols, or any combination thereof.

In a particular embodiment, the processor core 530 includes an instruction cache 532, a load/store unit 534, an arithmetic logic unit (ALU) unit 536, and a register file 538. The processor core 530 may include, or may function substantially similarly to, an ARM core, as an illustrative, non-limiting example. For example, the processor core 530 may support a reduced instruction set computer (RISC) microarchitecture. The processor core 530 may be configured to retrieve data and executable instructions 526 via the load/store unit 534 from the read only memory 524.

Alternatively, or in addition, at least some of the executable instructions 526 may not be stored at the ROM 524 and may instead be stored at the memory array 594. The executable instructions 526 may be retrieved from the memory array 594 and stored at the RAM 522. The processor core 530 may be configured to retrieve the executable instructions 526 from the RAM 522 for execution. The executable instructions 526 may include instructions to cause the processor core 530, upon detection of a power event, to send one or more commands to the storage component 508 to write data from the ReRAM 593 to the memory array 594. The executable instructions 526 may also include instructions to cause the processor core 530 to send one or more commands to the storage component 508 to request data to be provided to the controller component 504 from the ReRAM 593 and/or from the memory array 594.

The executable instructions 526 may be retrieved by the load/store unit 534 and stored to the instruction cache 532. The executable instructions 526 at the instruction cache 532 may be scheduled and provided to one or more execution pipelines, such as an execution pipeline including the ALU unit 536. The ALU unit 536 may include dedicated circuitry to perform arithmetic and logic operations, such as addition and subtraction, AND, NOT, OR, exclusive-OR (XOR), other arithmetic or logic operations, or any combination thereof.

The register file 538 may include multiple memory cells that may provide high speed access to the processor core 530 of data to be used for execution of instructions. One or more memory cells at the register file 538 may be dedicated to store a status indicator. Additional data values, such as values to indicate memory type, memory write status, and write protect status, may also be set during execution of the executable instructions 526 at the processor core 530.

The storage interface circuitry 540, such as the controller-to-memory interface 150 of FIG. 1 and/or the storage interface circuitry 414 of FIG. 4, may include data bus connectors 542, an output driver 544, input/output buffers and latches 546. The data bus connectors 542 may include electrical connectors to enable electrical signal propagation via the bus 506. The I/O buffers and latches 546 may be configured to store data that is received via the DMA/bus controller 520 to be transmitted via the bus 506 using electrical signals at the data bus connectors 542 that are generated by the output driver 544. In addition, or alternatively, the I/O buffers and latches 546 may store data values represented by electrical signals received at the data bus connectors 542 via the data bus 506, such as signals generated by the interface circuitry 590 of the storage component 508.

The error correction circuitry 548, such as the ECC engine 122 of FIG. 1, may include dedicated hardware and circuitry configured to perform operations (e.g., error detection operations and/or error correction operations) using data corresponding to the data that are received as a result of a memory read from the storage component 508. The storage interface circuitry 540 may include a flash memory interface, and the error correction circuitry 548 may be compliant with one or more flash error correcting code protocols.

In some embodiments, the controller component 504 may include or be coupled to a controller ReRAM (distinct from the ReRAM 593). The controller ReRAM may be coupled to the bus 521. For example, the controller ReRAM may be coupled to the bus 521 via a bus-to-controller interface included in the controller ReRAM or via an input/output interface coupled to the bus 521. The controller ReRAM may be included in the same die as the processor core 530, the RAM 522, the ROM 524, the DMA/bus controller 520, or a combination thereof. In other embodiments, the controller ReRAM may be coupled to the controller component 504 and may be on a separate die as the controller component 504, coupled to the controller component 504 via the input/output interface. The controller component 504 (e.g., the processor core 530) may use the controller ReRAM to store data that may be maintained during a low-power event, such as a power off of the data storage device 502. For example, the controller component 504 may utilize the controller ReRAM to store a copy of user data (received from a host device) to be stored at the memory array 594, metadata associated with the user data, logical-to-physical mapping data, block mapping data, processor variables, and/or processor context data.

The controller component 504 (e.g., the processor core 530) may be configured to access the storage component 508 (e.g., the memory array 594 and/or the ReRAM 593) via the storage interface circuitry 540. The data storage device 502 (e.g., the controller component 504) further includes a volatile memory, such as the RAM 522, having a dedicated bus-to-volatile memory interface and the controller ReRAM a dedicated bus-to-ReRAM interface. The volatile memory (e.g., the RAM 522) may be coupled to the bus 521 via the dedicated bus-to-volatile memory interface. The controller component 504 (e.g., the processor core 530) may be configured to store user data (received from the host device) at the memory array 594 and/or the ReRAM 593 via the storage interface circuitry 540 (e.g., a dedicated controller-to-non-volatile memory interface). The controller component 504 (e.g., the processor core 530 may also be configured to store control data at the controller ReRAM via the dedicated bus-to-ReRAM interface to preserve the control data during a power off event.

Figure 6:
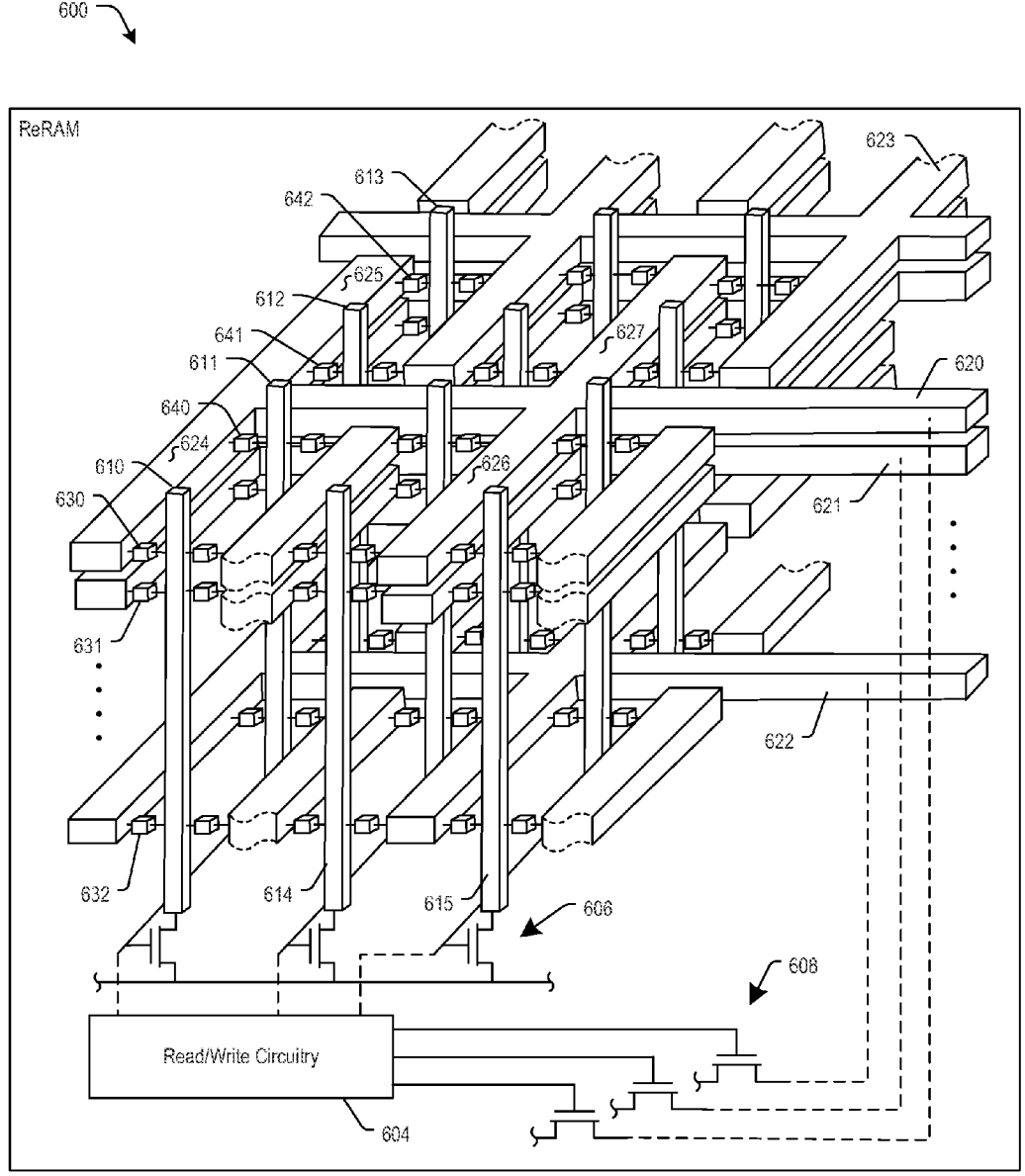
FIG. 6 is a block diagram of a particular embodiment of ReRAM.

FIG. 6 is a diagram of a particular embodiment of a memory 600. The memory 600 may be included in the data storage device 102 of FIG. 1, the data storage device 402 of FIG. 4, and/or the data storage device 502 of FIG. 5. FIG. 6 illustrates a portion of a three-dimensional architecture of the memory 600, such as a resistive random access memory (ReRAM). For example, the memory 600 may include the ReRAM 144 of FIG. 1, the ReRAM 425 of FIG. 4, and/or the ReRAM 593 of FIG. 5. In the embodiment illustrated in FIG. 6, the memory 600 (e.g., the ReRAM) includes a plurality of conductive lines in physical layers over a substrate (e.g., substantially parallel to a surface of the substrate), such as representative wordlines 620, 621, 622, and 623 (only a portion of which is shown in FIG. 6) and a plurality of vertical conductive lines through the physical layers, such as representative bit lines 610, 611, 612, and 613.

The memory 600 also includes a plurality of resistance-based storage elements (e.g., memory cells), such as representative storage elements 630, 631, 632, 640, 641, and 642, each of which is coupled to a bit line and a wordline in arrays of memory cells in multiple physical layers over the substrate (e.g., a silicon substrate). The memory 600 also includes read/write circuitry 604, such as the read circuitry 140 of FIG. 1, the write circuitry 142 of FIG. 1, or a combination thereof. The read/write circuitry 604 is coupled to wordline drivers 608 and bit line drivers 606.

In the embodiment illustrated in FIG. 6, each of the wordlines includes a plurality of fingers (e.g., a first wordline 620 includes fingers 624, 625, 626, and 627). Each finger may be coupled to more than one bit line. To illustrate, a first finger 624 of the first wordline 620 is coupled to a first bit line 610 via a first storage element 630 at a first end of the first finger 624 and is coupled to a second bit line 611 via a second storage element 640 at a second end of the first finger 624.

In the embodiment illustrated in FIG. 6, each bit line may be coupled to more than one wordline. To illustrate, the first bit line 610 is coupled to the first wordline 620 via the first storage element 630 and is coupled to a third wordline 622 via a third storage element 632.

During a write operation, the controller 120 may generate or receive data from a host device, such as the host device 130 of FIG. 1. The controller 120 may send the data (or a representation of the data) to the memory 600. For example, the controller 120 may encode the data prior to sending the encoded data to the memory 600.

The read/write circuitry 604 may write the data to storage elements corresponding to the destination of the data. For example, the read/write circuitry 604 may apply selection signals to selection control lines coupled to the wordline drivers 608 and the bit line drivers 606 to cause a write voltage to be applied across a selected storage element. For example, to select the first storage element 630, the read/write circuitry 604 may activate the wordline drivers 608 and the bit line drivers 606 to drive a programming current (also referred to as a write current) through the first storage element 630. To illustrate, a first write current may be used to write a first logical value (e.g., a value corresponding to a high-resistance state) to the first storage element 630, and a second write current may be used to write a second logical value (e.g., a value corresponding to a low-resistance state) to the first storage element 630. The programming current may be applied by generating a programming voltage across the first storage element 630 by applying a first voltage to the first bit line 610 and to wordlines other than the first wordline 620 and applying a second voltage to the first wordline 620. In a particular embodiment, the first voltage is applied to other bit lines (e.g., the bit lines 614, 615) to reduce leakage current in the memory 600.

During a read operation, such as in response to detecting that a power event interrupted a data write operation at another non-volatile memory, the controller 120 may cause the read/write circuitry 604 to read bits from particular storage elements of the memory 600 by applying selection signals to selection control lines coupled to the wordline drivers 607 and the bit line drivers 606 to cause a read voltage to be applied across a selected storage element. For example, to select the first storage element 630, the read/write circuitry 604 may activate the wordline drivers 608 and the bit line drivers 606 to apply a first voltage (e.g., 0.7 volts (V)) to the first bit line 610 and to wordlines other than the first wordline 620. A lower voltage (e.g., 0 V) may be applied to the first wordline 620. Thus, a read voltage is applied across the first storage element 630, and a read current corresponding to the read voltage may be detected at a sense amplifier of the read/write circuitry 604. The read current corresponds (via Ohm's law) to a resistance state of the first storage element 630, which corresponds to a logical value stored at the first storage element 630. The logical value read from the first storage element 630 and other elements read during the read operation may be provided to the controller 120.

Alternatively, a read operation of the memory 600 may be initiated by the controller 430 of FIG. 4 and/or the controller 592 of FIG. 5. A logical value read from the memory 600 may be provided to a non-volatile memory of the data storage device that includes the memory 600. For example, the logical value may be provided to the memory 104 via the set of latches 182 of FIG. 1, to the memory array 440 via the latches 426 of FIG. 4, and/or to the memory array 594 via the latches 591 of FIG. 5.

Figure 7:
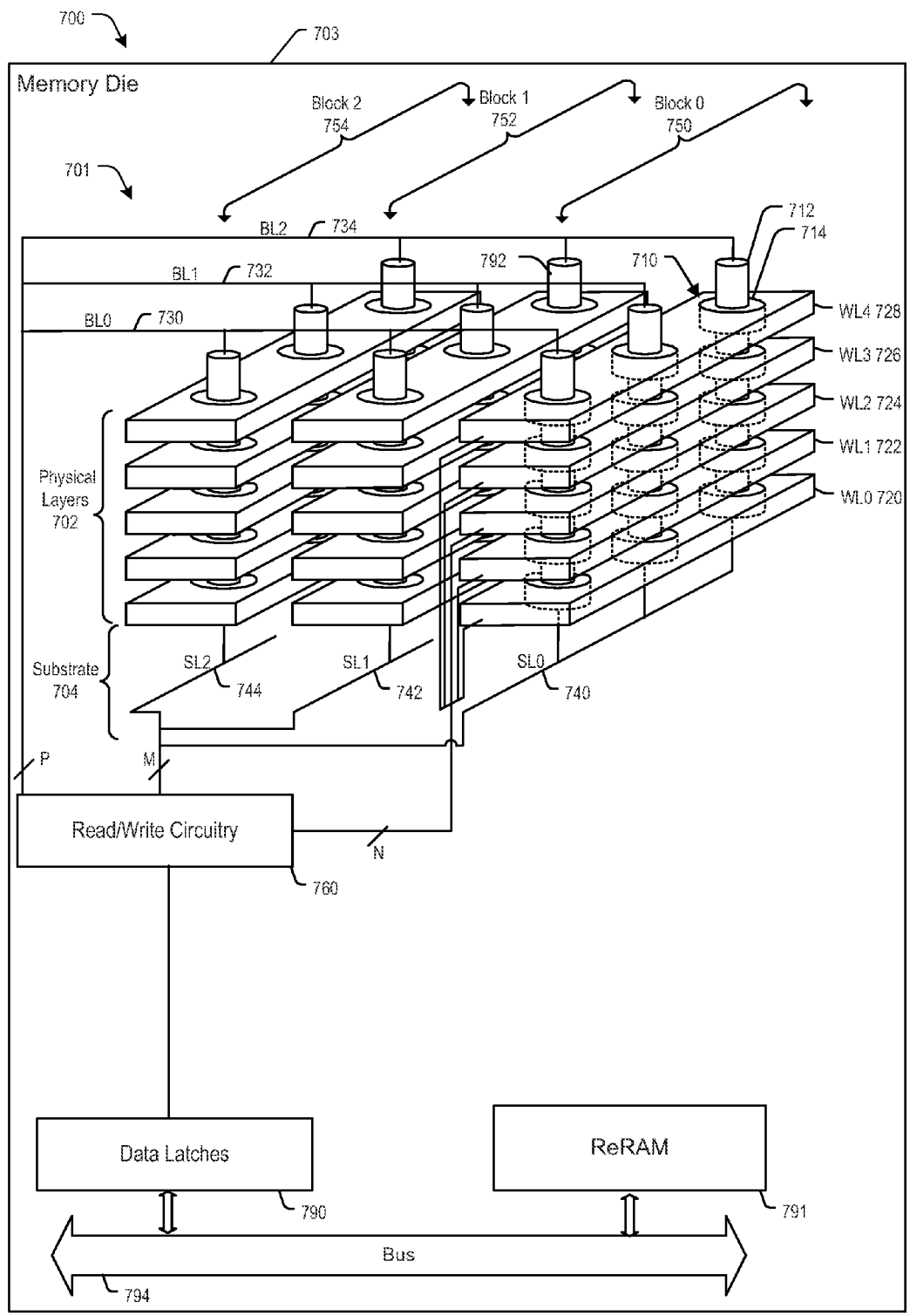
FIG. 7 is a block diagram of a particular embodiment of the non-volatile memory of the data storage device of FIG. 1, the data storage device of FIG. 4, and/or the data storage device of FIG. 5.

FIG. 7 illustrates an embodiment of a memory device 700. The memory device 700 may include a memory die 703, such as the memory die 103 of FIG. 1. The memory device 700 may include a 3D memory 701 in a NAND flash configuration. The 3D memory 701 may include or correspond to the memory 104 of FIG. 1, the memory array 440 of FIG. 4, and/or to the memory array 594 of FIG. 5. The memory die 703 may also include read/write circuitry 760, data latches 790, a ReRAM 791, and a bus 794. The data latches 790 may include or correspond to the set of latches 182 of FIG. 1, the latches 426 of FIG. 4, and/or the latches 591 of FIG. 5. The ReRAM 791 may include or correspond to the ReRAM 144 of FIG. 1, the ReRAM 425 of FIG. 4, the ReRAM 593 of FIG. 5, and/or the memory 600 of FIG. 6. The bus 794 may include or correspond to the bus 106, the bus 176 of FIG. 1, the bus 406, the bus 407 of FIG. 4, the bus 506, and/or the bus 595 of FIG. 5.

The 3D memory 701 includes multiple physical layers 702, that are monolithically formed above a substrate 704, such as a silicon substrate. Storage elements (e.g., memory cells), such as a representative memory cell 710, are arranged in arrays in the physical layers 702.

The representative memory cell 710 includes a charge trap structure 714 between a wordline/control gate (WL4) 728 and a conductive channel 712. Charge may be injected into or drained from the charge trap structure 714 via biasing of the conductive channel 712 relative to the wordline 728. For example, the charge trap structure 714 may include silicon nitride and may be separated from the wordline 728 and the conductive channel 712 by a gate dielectric, such as a silicon oxide. An amount of charge in the charge trap structure 714 affects an amount of current through the conductive channel 712 during a read operation of the memory cell 710 and indicates one or more bit values that are stored in the memory cell 710.

The 3D memory 701 includes multiple erase blocks, including a first block (block 0) 750, a second block (block 1) 752, and a third block (block 2) 754. Each block 750-754 includes a "vertical slice" of the physical layers 702 that includes a stack of wordlines, illustrated as a first wordline (WL0) 720, a second wordline (WL1) 722, a third wordline (WL2) 724, a fourth wordline (WL3) 726, and the fifth wordline (WL4) 728. Multiple conductive channels (having a substantially vertical orientation with respect to FIG. 7) extend through the stack of wordlines. Each conductive channel is coupled to a storage element in each wordline 720-728, forming a NAND string of storage elements. FIG. 7 illustrates three blocks 750-754, five wordlines 720-728 in each block, and three conductive channels in each block for clarity of illustration. However, the 3D memory 701 may have more than three blocks, more than five wordlines per block, and more than three conductive channels per block.

The read/write circuitry 760 is coupled to the conductive channels via multiple conductive lines, illustrated as a first bit line (BL0) 730, a second bit line (BL1) 732, and a third bit line (BL2) 734 at a "top" end of the conducive channels (e.g., farther from the substrate 704) and a first source line (SL0) 740, a second source line (SL1) 742, and a third source line (SL2) 744 at a "bottom" end of the conductive channels (e.g., nearer to or within the substrate 704). The read/write circuitry 760 is illustrated as coupled to the bit lines 730-734 via "P" control lines, coupled to the source lines 740-744 via "M" control lines, and coupled to the wordlines 720-728 via "N" control lines. Each of P, M, and N may have a positive integer value based on the specific configuration of the 3D memory 701. In the illustrative example of FIG. 7, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 792 and a particular source line may be coupled to the top of the conductive channel 712. The bottom of the conductive channel 792 may be coupled (e.g., electrically coupled) to the bottom of the conductive channel 712. Accordingly, the conductive channel 792 and the conductive channel 712 may be coupled in series and may be coupled to the particular bit line and the particular source line.

The read/write circuitry 760 may operate as described with respect to the read circuitry 140 of FIG. 1, the write circuitry 142 of FIG. 1, or a combination thereof. For example, data may be stored to storage elements coupled to the wordline 728 and the read/write circuitry 760 may read bit values from the storage elements. As another example, the read/write circuitry 760 may apply selection signals to control lines coupled to the wordlines 720-728, the bit lines 730-734, and the source lines 740-742 to cause a programming voltage (e.g., a voltage pulse or series of voltage pulses) to be applied across selected storage element(s) of the selected wordline (e.g., the fourth wordline 728).

During a read operation, the controller 120 may receive a request from a host device, such as the host device 130 of FIG. 1. The controller 120 may cause the read/write circuitry 760 to read bits from particular storage elements of the 3D memory 701 by applying appropriate signals to the control lines to cause storage elements of a selected wordline to be sensed. Accordingly, the 3D memory 701 may be configured to read from and write data to one or more storage elements.

Although various components of the data storage device 102 and the host device 130 of FIG. 1, the data storage device 402 of FIG. 4, the data storage device 502 of FIG. 5, the memory 600 of FIG. 6, and the memory device 700 of FIG. 7, are depicted herein are illustrated as block components and described in general terms, such components may include one or more microprocessors, state machines, or other circuits configured to enable the various components to perform operations described herein. One or more aspects of the various components may be implemented using a microprocessor or microcontroller programmed to perform operations described herein, such as one or more operations of the method 200 and/or the method 220 of FIG. 2. In a particular embodiment, the controller 120, the memory die 103 (e.g., the read circuitry 140, the write circuitry 142, and/or the interface circuitry 143, such as the splitter 175) of FIG. 1, the controller 412, the interface circuitry 420, the controller 430 of FIG. 4, the processor core 530, the DMA/bus controller 520, the interface circuitry 590, and/or the controller 592 of FIG. 5, includes a processor executing instructions that are stored at a memory, such as a non-volatile memory of the data storage device 102 or the host device 130. Alternatively or additionally, executable instructions that are executed by the processor may be stored at a separate memory location that is not part of the non-volatile memory, such as at a read-only memory (ROM) of the data storage device 102 or the host device 130 of FIG. 1, the data storage device 402 of FIG. 4, or the data storage device 502 of FIG. 5.

In an illustrative example, the processor may execute the instructions to receive data from a memory controller via a bus. The instructions to receive the data may include instructions to determine one or more destinations of the data and/or instructions to identify an address associated with the data, as illustrative, non-limiting examples. The processor may execute instructions to route the data to data latches of a non-volatile memory via a first path and to a resistive random access memory (ReRAM) via a second path distinct from the first path. For example, the first path and the second path may include or correspond to the first path 193 and the second path 195 of FIG. 1, respectively. The instructions to route the data may include instructions to route the data to the ReRAM prior to routing the data to the non-volatile memory, instructions to route the data to the non-volatile memory prior to routing the data to the ReRAM, instructions to concurrently route the data to the ReRAM and to the non-volatile memory, and/or instructions to change a configuration of one or more switches to route the data, as illustrative, non-limiting examples.

Semiconductor memory devices, such as the memory 104, the ReRAM 144 of FIG. 1, the memory array 440, the ReRAM 425 of FIG. 4, the memory array 594, the ReRAM 593 of FIG. 5, the memory 600 of FIG. 6, or the memory 700 of FIG. 7, include volatile memory devices, such as dynamic random access memory ("DRAM") or static random access memory ("SRAM") devices, non-volatile memory devices, such as resistive random access memory ("ReRAM"), electrically erasable programmable read only memory ("EE- PROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor material, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. To illustrate, each of the memory device levels may have a corresponding substrate thinned or removed before stacking the memory device levels to form memory arrays. Because each of the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the memory 104, the ReRAM 144 of FIG. 1, the memory array 440, the ReRAM 425 of FIG. 4, the memory array 594, the ReRAM 593 of FIG. 5, the memory 600 of FIG. 6, the 3D memory 701, or the ReRAM 791 of FIG. 7 is a non-volatile memory having a three-dimensional (3D) memory configuration that is monolithically formed in one or more physical levels of arrays of memory cells having an active area disposed above a silicon substrate. The active area of a memory cell may be an area of the memory cell that is conductively throttled by a charge trap portion of the memory cell. The data storage device 102 and/or the host device 130 of FIG. 1, the data storage device 402 of FIG. 4, the data storage device 502 of FIG. 5, the memory 600 of FIG. 6, and/or the memory device 700 of FIG. 7 may include circuitry, such as read/write circuitry, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate controller chip and/or on the same substrate as the memory elements One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
    in a data storage device that includes a non-volatile memory and a resistive random access memory (ReRAM) on the same die, performing:
        receiving data from a memory controller via a bus;
        routing the data to data latches of the non-volatile memory via a first path of the bus; and
        concurrently with routing the data to the data latches, routing the data to the ReRAM via a second path of the bus that is distinct from the first path.

2. The method of claim 1, further comprising initiating a write operation of the data to the non-volatile memory.

3. The method of claim 2, further comprising, in response to a power event interrupting the write operation, reading the data from the ReRAM and providing the read data to the data latches of the non-volatile memory.

4. The method of claim 2, further comprising initiating a second write operation of the data to the non-volatile memory after the read data from the ReRAM is provided to the data latches.

5. The method of claim 1, wherein the bus includes a splitter, wherein data provided to the bus from the memory controller is received at the splitter and provided to a first interface of the non-volatile memory and to a second interface of the ReRAM.

6. The method of claim 1, wherein the non-volatile memory is configured to use the latches to access the data communicated via the bus and to route the data via the bus, and wherein the ReRAM includes a bus-to-ReRAM interface to access the data communicated via the bus and to route the data via the bus.

7. The method of claim 1, wherein the ReRAM is coupled to the bus via a NAND interface.

8. The method of claim 7, wherein the NAND interface includes an open NAND flash interface (ONFI) compliant interface.

9. The method of claim 1, wherein a first write time to write the data to the ReRAM is shorter than a second write time to write the data to the non-volatile memory.

10. The method of claim 1, wherein a first size of the non-volatile memory is larger than a second size of the ReRAM.

11. The method of claim 1, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

12. The method of claim 1, wherein the non-volatile memory comprises a flash memory.

13. A method comprising:
    in a data storage device that includes a non-volatile memory and a resistive random access memory (ReRAM) on the same die, performing:
        receiving data from a memory controller via a bus, the data including user data to be stored at a location of the non-volatile memory, and wherein the data further indicates a physical address that corresponds to the location;
        concurrently providing the data to both of the ReRAM and data latches of the non-volatile memory; and
        storing the data at the ReRAM.

14. The method of claim 13, wherein the data includes logical-to-physical mapping data associated with a logical-to-physical mapping table that corresponds to the non-volatile memory.

15. The method of claim 13, wherein the data includes processor variables, processor context data, or both, associated with a processor core of a controller included in the data storage device.

16. The method of claim 13, wherein a first size of the non-volatile memory is larger than a second size of the ReRAM.

17. The method of claim 13, wherein the non-volatile memory comprises a flash memory.

18. The method of claim 13, further comprising storing the data at the non-volatile memory, wherein the data is concurrently stored at the non-volatile memory and at the ReRAM.

19. The method of claim 13, wherein storing the data at the ReRAM includes overwriting other data previously stored at the ReRAM.

20. The method of claim 13, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

21. A data storage device comprising:
    a controller;

a memory die coupled to the controller, wherein the memory die includes a resistive random access memory (ReRAM) and a NAND flash memory; and wherein the controller is configured to receive first data and second data to be written to the NAND flash memory, wherein the controller is configured to concurrently send the first data to both of the NAND flash memory and the ReRAM, wherein the ReRAM is configured to receive and store the first data to be written to the NAND flash memory, wherein the ReRAM is configured to receive the second data to be written to the NAND flash memory after the first data is written to the NAND flash memory, and wherein the second data stored at the ReRAM overwrites the first data stored at the ReRAM.

22. The data storage device of claim 21, further comprising a bus coupled to the controller, wherein the bus is further coupled to the NAND flash memory and to the ReRAM.

23. The data storage device of claim 22, wherein the controller is included in a particular die that is distinct from the memory die, and wherein the memory die includes a plurality of data latches coupled to the NAND flash memory.

24. The data storage device of claim 23, wherein the plurality of data latches is coupled to the bus, and wherein the controller is configured to concurrently send the second data to the NAND flash memory and to the ReRAM subsequent to the first data being sent to the NAND flash memory and to the ReRAM.

25. The data storage device of claim 22, wherein the controller is configured to receive user data from a host device and to send the user data to the memory die to be stored at the NAND flash memory, wherein the user data includes the first data and the second data.

26. The data storage device of claim 21, wherein a first size of the NAND flash memory is larger than a second size of the ReRAM.

27. The data storage device of claim 21, wherein the NAND flash memory includes a three-dimensional (3D) memory configuration that is monolithically formed in one or more physical levels of arrays of memory cells having an active area disposed above a silicon substrate, and further comprising circuitry associated with operation of the memory cells.

* * * * *